(12) United States Patent
Wilbur et al.

(10) Patent No.: US 6,664,500 B2
(45) Date of Patent: Dec. 16, 2003

(54) LASER-TRIMMABLE DIGITAL RESISTOR

(75) Inventors: Mark Steven Wilbur, Branchburg, NJ (US); Sheo Kumar Khetan, Martinsville, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 09/737,699

(22) Filed: Dec. 16, 2000

(65) Prior Publication Data

US 2002/0074319 A1 Jun. 20, 2002

(51) Int. Cl.[7] ............................................. B23K 26/38
(52) U.S. Cl. ............................ 219/121.69; 219/121.68
(58) Field of Search ..................... 219/121.68, 121.69, 219/121.61; 338/195

(56) References Cited

U.S. PATENT DOCUMENTS

| | | | |
|---|---|---|---|
| 2,261,667 A | 11/1941 | Stroszeck ................... 338/195 |
| 3,680,013 A | 7/1972 | Pye ............................. 333/81 |
| 3,930,304 A | 1/1976 | Keller et al. ................... 29/574 |
| 3,983,528 A | 9/1976 | King .......................... 338/195 |
| 4,150,366 A | 4/1979 | Price .......................... 340/347 |
| 4,191,938 A | 3/1980 | Gow, 3rd et al. ........... 338/195 |
| 4,201,970 A | 5/1980 | Onyshkevych .............. 338/195 |
| 4,228,418 A | 10/1980 | Piedmont et al. ........... 338/195 |
| 4,240,094 A | 12/1980 | Mader ......................... 357/45 |
| 4,283,774 A | 8/1981 | Schwartz et al. .............. 365/8 |
| 4,298,856 A | 11/1981 | Schuchardt ................. 338/195 |
| 4,349,792 A | 9/1982 | Scheiner ...................... 333/81 |
| 4,381,441 A | 4/1983 | Desmarais et al. .......... 219/121 |
| 4,399,345 A | * | 8/1983 | Lapham et al. |
| 4,772,774 A | 9/1988 | Lejeune et al. ......... 219/121.69 |
| 4,774,492 A | 9/1988 | Shier .......................... 338/309 |
| 4,782,320 A | 11/1988 | Shier .......................... 338/295 |
| 4,899,126 A | 2/1990 | Yamada ...................... 338/309 |
| 4,906,966 A | 3/1990 | Imamura et al. ............ 338/195 |
| 4,918,284 A | * | 4/1990 | Weisz .................... 219/121.69 |
| 4,947,020 A | * | 8/1990 | Imamura et al. ....... 219/121.65 |
| 4,962,294 A | * | 10/1990 | Beckham et al. ...... 219/121.68 |
| 5,015,989 A | 5/1991 | Wohlfarth et al. ........... 338/195 |
| 5,065,221 A | 11/1991 | Imamura ..................... 357/51 |
| 5,265,114 A | 11/1993 | Sun et al. ..................... 372/69 |
| 5,284,794 A | * | 2/1994 | Isobe et al. |
| 5,323,138 A | * | 6/1994 | Oki et al. ................... 338/195 |

(List continued on next page.)

OTHER PUBLICATIONS

Iwasaki et al., "New On–Wafer Digital Trimming Technique for Current Adjustment of GaAs FET", May 4, 2002, Proceedings of GaAs MANTECH, pp. 117–120.*

(List continued on next page.)

Primary Examiner—Geoffrey S. Evans
(74) Attorney, Agent, or Firm—Pennie & Edmonds LLP (57) ABSTRACT

A laser system and method for cleanly trimming or severing resistive links fabricated on in undoped gallium arsenide substrate without damaging or affecting adjacent circuit structures or the underlying or surrounding substrate is disclosed. The system includes a laser source adapted to generate an output at a wavelength within the range of 0.9 to 1.5 μm, a resistive film structure formed on an undoped gallium arsenide substrate, and a beam positioner and alignment system to align the laser source with the target structure. The method includes generating a laser output at a wavelength in a range of about 0.9 to 1.5 μm and directing the laser output to illuminate a resistive thin-film structure fabricated on a gallium arsenide substrate. The resistive film structure includes a first layer of protective dielectric and a layer of resistive thin-film material. Preferably, a second layer of protective dielectric lies upon the layer of resistive thin-film material. Further, there is disclosed a resistive trim network suitable for use with a bias circuit for a power amplifier that requires a quiescent current of 130 mA. The trim network includes eleven thin-film resistors arranged in an asymmetrical array of series resistors, parallel resistors, and tying resistors.

20 Claims, 6 Drawing Sheets

SAMPLE OF QUIESCENT CURRENT DISTRIBUTION FOR LASER-TRIMMED PARTS

U.S. PATENT DOCUMENTS

| | | | |
|---|---|---|---|
| 5,379,190 A | | 1/1995 | Hanamura et al. .......... 361/766 |
| 5,408,574 A | | 4/1995 | Deevi et al. ................ 392/404 |
| 5,493,148 A | | 2/1996 | Ohata et al. ................ 257/538 |
| 5,502,885 A | | 4/1996 | Hanamura et al. ............ 29/621 |
| 5,548,269 A | | 8/1996 | Katsuno et al. ............. 338/325 |
| 5,569,398 A | | 10/1996 | Sun et al. ............... 219/121.68 |
| 5,683,928 A | | 11/1997 | Wojnarowski et al. ........ 437/60 |
| 5,710,538 A | | 1/1998 | Zinn et al. .................. 338/195 |
| 5,808,272 A | | 9/1998 | Sun et al. ............... 219/121.68 |
| 6,025,256 A | | 2/2000 | Swenson et al. ............ 438/601 |
| 6,040,226 A | | 3/2000 | Wojnarowski et al. ...... 438/381 |
| 6,057,180 A | | 5/2000 | Sun et al. .................... 438/132 |
| 6,201,288 B1 | * | 3/2001 | Iwasaki et al. |
| 6,281,471 B1 | * | 8/2001 | Smart .................... 219/121.69 |
| 6,326,256 B1 | * | 12/2001 | Bailey et al. |

OTHER PUBLICATIONS

Frederick H. Fischer, "Laser Programming of Gallium Arsenide HFET Digital Integrated Circuits", 1988, pp. 1–89 Lehigh University Thesis.

Tadanori Yamaguchi, et al., Process and Device Optimization of an Analog Complementary Bipolar IC Technology with 5.5–GHZ FT PNP Transitors, IEEE Transactions on Electron Devices, 1994, pp. 1019–1026.

Larry A. Geis, et al., "A Novel RF to Baseband Monolithic Microwave Receiver with On–Chip Tuning", Microwave Symposium Digest, 1997, pp. 1151–1154.

Wang Ruoxu, "Design of a High Speed 12–Bit Subranging A/D Converter", 1998 $5^{th}$ International Conference on Solid–State Integrated Circuit Technology, 1998, pp. 389–392.

Bruce W. Ohme, et al., "Control Circuit Design for High Temperature Linear Regulators", 1998 Fourth International, 1998, pp. 45–50.

D. Scott Langford, et al., "A BiCMOS Analog Front–End Circuit for an FDM–Based ADSL System", Bipolar/BiCMOS Circuits and Technology Meeting, 1997, pp. 180–182.

Chang–Ming Lin, et al., "Precision Embedded Thin Film Resistors for Multichip Modules (MCM–D)", Multi–Chip Module Conference, 1997, pp. 44–49.

B. Brakus, et al., "The New Generation of Board Mounted Modules for Telecom", Telecommunications Energy Conference, 1994, pp. 581–587.

D. Scott Langford, et al., "A BiCMOS Analog Front–End Circuit for an FDM–Based ADSL System", Solid–State Circuits, Sep. 1998, pp. 1383–1393.

A. Paul Brokaw, "A Temperature Sensor with Single Resistor Set–Point Programming", Solid–State Circuits, Dec. 1996, pp. 1908–1915.

Babak Ziaie, et al., "A Low–Power Miniature Transmitter Using a Low–Loss Silicon Platform for Biotelemetry", Engineering in Medicine and Biology Society, 1997, pp. 2221–2224.

Kazuyoshi Yamaguchi, "Development of LCR Laser Function Trimming Unit", Electronic Manufacturing Technology Symposium, 1995, pp. 283–286.

B.J. Tesch, et al., "A Low Glitch 14–b 100–MHz D/A Converter", Solid–State Circuits, Sep. 1997, pp. 1465–1469.

"Optical Properties of Semiconductors" in Handbook of Optics vol. II, Devices, Measurements and Properties, (Michael Bass, et al. Eds.), 1995, pp. 36, 19 36, 25.

"Pulsed Laser Processing of Semiconductors" in Semiconductors and Semimetals, (R.F. Wood and C.W. White, Eds.), 1984, Contents Section.

W. Cochran, et al., "Lattice Adsorption in Gallium Arsenide", Journal of Applied Physics, Oct. 1961, pp. 2102–2106.

Henry Ching–Ye Hsiaw, "Molecular Obrital Topology and Optical Properties of Gallium Arsenide Clusters", IEEE Journal of Quantam Electronics, Oct. 1988, pp. 1996–2000.

Sheila G. Bailey, et al., "Enhancing Optical Adsorption in InP and GaAs Utilizing Profile Etching", Photovoltaic Specialists Conference—1991, pp. 235–240.

Marvin L. Cohen and James R. Chelikowsky, "Electronic Structure and Optical Properties of Semiconductors", Springer–Verlag, 1988.

D.D. Sell, et al. "Concentration Dependence of the Refractive Index for n—and p—type GaAs between 1.2 and 1.8 eV", Journal of Applied Physics, 1974, pp. 2650–2657.

M.B. Panish, et al. "Temperature Dependence of the Energy Gap in GaAs and GaP", Journal of Applied Physics, 1996, pp. 163–167.

B.J. Skromme, et al., "Excited–State–Donor—t—Acceptor Transistions in the Photoluminescence Spectrum of GaAs and InP", Physical Review B, Feb. 15, 1994, pp. 1982–1992.

J. Camassel, "Temperature Dependence of the Band Gap and Comparison with the Threshold Frequency of Pure GaAs Lasers", Journal of Applied Physics, 1975, pp. 2683–2689.

C. Alibert, et al., "Electroreflectance and Spectroscopic Ellipsometry Studies of GaAs/GaAlAs Heterojunctions", Journal de Physique, pp. c10–229—c10–233.

P. Lautenschlager, et al., "Interband Critical Points of GaAs and their Temperature Dependence", Physical Review B, Jun. 1997, pp. 9174–9189.

D.D. Sell, "Resolved Free–Exciton Transitions in the Optical–Absorption Spectrum of GaAs", Physical Review B, Nov. 1972, pp. 3750–3753.

K.G. Hambleton, et al. "Determination of the Effective Ionic Charge of Gallium Arsenide from Direct Measurements of the Dielectric Constant", Proceedings of the Physical Society, Jan. 1961, pp. 1147–1148.

M. Cardona, "Temperature Dependence of the Refractive Index and the Polarizability of Free Carriers in Some III–V Semiconductors", Proceedings of the International Conference on Semiconductors Physics, 1960, pp. 388–394.

A. Mooradian, et al., "First Order Raman Effect in III–V Compounds", Solid State Communications, 1966, pp. 431–434.

http://physics.nist.gov/PhysRefData/XrayMassCoef/cover.html, NIST X–Ray Mass Attenuation Coefficients, Dec. 14, 2000.

http://www.almazoptics.com/homepage/GaAs.htm, Gallium Arsenide, GaAs, Gallium Arsenide Transmission—Almaz Options, Inc., Dec. 14, 2000.

wysiwyg://219/http://www.aip.org/pt/vol–53/iss–8/captions/p29cap2.html, Physics Today Online—Feature, Dec. 14, 2000.

http://www.ece.utexas.edu/projects/ . . . c/groups/street__mbe/mbechapter.html, MBE Growth, Dec. 14, 2000.

http://www.ioffe.rssi.ru/SVA/NSM/Semicond/GaAs/optic.html, Optical Properties of Gallium Arsenide (GaAs), Dec. 14, 2000.

http://www.dur.ac.uk/d.p.halliday/pub31.html, Optical Properties of Ultra Thin 50mm GaAs Membranes, Dec. 14, 2000.

http://www.janostech.com/techinfo/gaas.html, Janos Technology, Inc. Precision Optical Components, Dec. 14, 2000.

http://utopia.cord.org/em/leot/course06__mod04/mod06__04.htm, Module 6–4 Windows, Dec. 14, 2000.

* cited by examiner

*Fig. 1*
*(Prior Art)*

FREE CARRIER ABSORPTION VERSUS WAVELENGTH AT DIFFERENT DOPING LEVELS, 296 K
(SPITZER AND WHELAN [1959]).
CONDUCTION ELECTRON CONCENTRATIONS ARE:
1. $1.3 \times 10^{17} cm^{-3}$; 2. $4.9 \times 10^{17} cm^{-3}$; 3. $10^{18} cm^{-3}$; 4. $5.4 \times 10^{18} cm^{-3}$

SAMPLE OF QUIESCENT CURRENT DISTRIBUTION FOR LASER-TRIMMED PARTS

Fig. 7

LASER-TRIMMABLE DIGITAL RESISTOR

FIELD OF THE INVENTION

The present invention relates to a laser system for trimming or severing thin-film resistors fabricated on an undoped gallium arsenide substrate. The present invention also relates to a laser-trimmable resistor network suitable for use in bias circuits for power amplifiers.

BACKGROUND OF THE INVENTION

Many integrated circuits, such as bias circuits for power amplifiers, include individual resistors that are required to have a specific value to achieve a desired circuit performance level. According to U.S. Pat. No. 4,782,320 issued to Shier, in applications of these types, the accuracies of individual resistors prior to trimming are typically on the order of only 15–20%, because there are wide manufacturing variations in the sheet resistance of the integrated circuit. These single resistors must then be trimmed using off-chip resistors to accurately reach a predetermined resistance value.

Other circuits do not require that an absolute value of a resistor be obtained, but rather require that two resistors be accurately matched in value, one relative to the other. Creating a closely-matched pair of resistors is easier than creating an individual resistor with a certain resistance value, because process variations in the former affect both matched resistors equally. Thus, the level of matching of integrated circuit resistors that is achievable by controlling parameters of the manufacturing process is approximately 0.1–0.3%, as described by Shier. But for some circuits, such as analog-to-digital converters, even this degree of precision is inadequate.

In order to achieve a higher level of precision than that achievable by fabrication processes, it is known in the art to use a laser to trim a thin-film resistor fabricated on a silicon substrate. The laser alters the shape of a resistor and thereby brings its resistance to a desired value. Alternatively, the resistor may be severed altogether, if used as part of a resistor trimming network.

Figure 1:
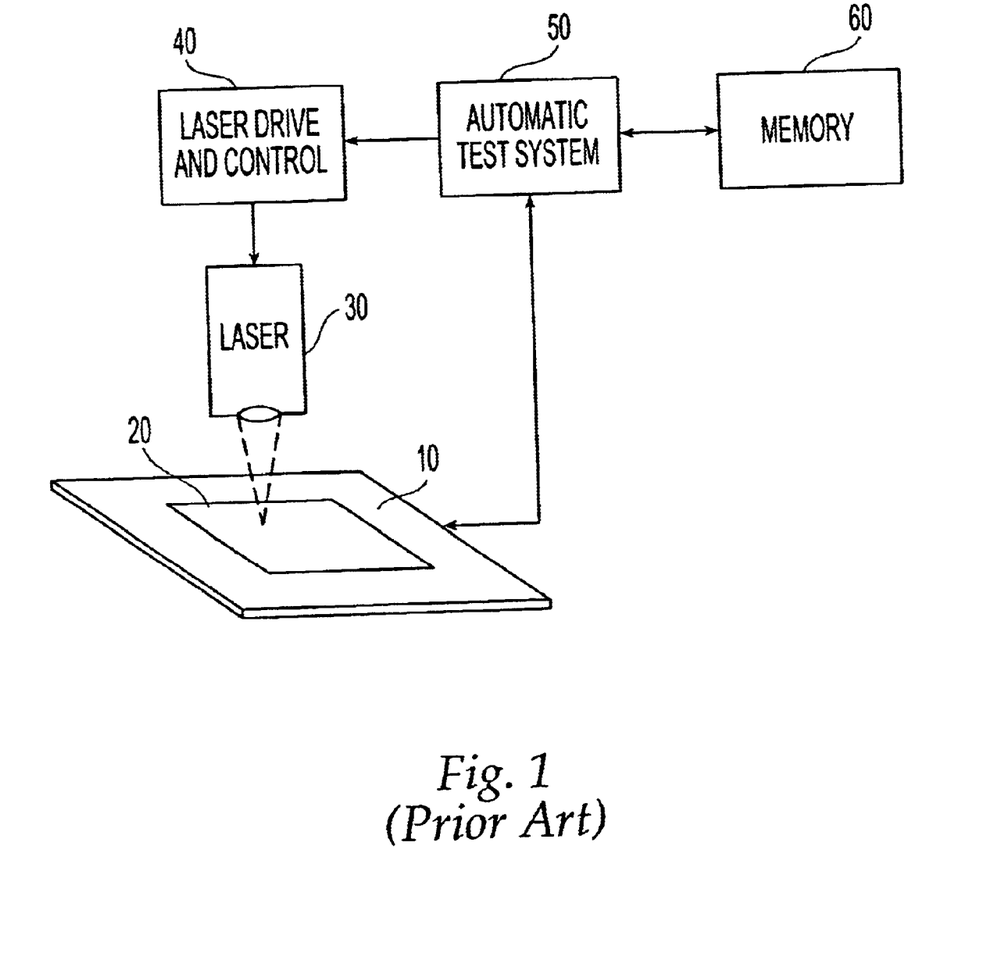
FIG. 1 is a block diagram illustrating a conventional laser trimming system.

A conventional laser-trimming system is shown in FIG. 1. An integrated circuit 10 includes a trimmable resistor 20 and other circuit elements (not shown) that are fabricated on a silicon substrate. Resistor 20 is typically made from a resistive thin-film material, such as nickel chromide, tantalum nitride, cesium silicide, disilicide, and polycide.

Integrated circuit 10 is coupled to an automatic test system 50 that measures the electrical properties of integrated circuit 10 in its untrimmed state. In response to the measured electrical properties, automatic test system 50 computes a desired trimming resistance. A predetermined trim pattern is obtained from memory 60 and provided to the laser drive and control 40. In response, laser drive and control 40 positions laser 30 at desired positions over integrated circuit 10 and actuates the laser to produce a radiation beam that is focused on a predetermined area of the trimmable resistor 20.

The wavelength of this radiation beam is typically selected based upon the light absorption characteristics of the silicon substrate and the resistive material. At certain wavelengths (for example, 1.32 μm), the silicon substrate is almost transparent to the beam, while resistor 20 absorbs it. Thus, at these wavelengths, portions of resistor 20 may be vaporized without causing damage to the silicon substrate.

The laser-trimming technique described in the above paragraphs has been successfully employed to trim resistors fabricated on a silicon substrate. Clearly, it would be very desirable to employ the technique to trim resistors fabricated on a gallium arsenide substrate as well. But to the inventors' knowledge, no one had successfully done so at the time of the present invention.

In fact, only one reference has been found that mentions laser trimming of resistors fabricated on gallium arsenide: U.S. Pat. No. 5,569,398 issued to Sun et al. This reference suggests that resistors fabricated on gallium arsenide may be trimmed using a laser with an output wavelength within the range from 1.0 to 3.0 μm. Sun et al. derives this wavelength range (1.0 to 3.0 μm) by: (1) identifying wavelengths at which gallium arsenide is believed not to absorb laser light (those wavelengths above 1.0 μm); (2) identifying the wavelengths at which metallic thin-film resistive materials (such as platinum, nickel, tungsten, and aluminum) are known to absorb laser light (about 0.0 to 3.0 μm); and (3) comparing the former and the latter wavelength ranges to obtain a range in which the gallium arsenide substrate does not absorb laser light, while the metallic resistive material does: 1.0 to 3.0 μm.

Sun et al.'s suggestion that gallium arsenide does not absorb laser light having a wavelength from 1.0 μm to 3.0 μm is also supported by the experimental results of W. G. Spitzer and J. M. Whelan, as published in *Physics Review*, 114, 1 (1959) 59–63 and reproduced herein as FIG. 2. Spitzer and Whelan studied the relationship between the optical absorption characteristics of gallium arsenide and the doping level in gallium arsenide, for various wavelengths. Specifically, they showed that a strong correlation exists between the conduction electron concentrations induced by various levels of doping and the optical absorption coefficient. (The term "optical absorption coefficient" is defined as a unit of measure of the attenuation caused by the absorption of energy that results from its passage through a medium. Absorption coefficients are usually expressed in units of reciprocal distance. See Terms and Definitions, MIL-STD-2196 (SH), Glossary, Fiber Optics (1989).)

Figure 2:
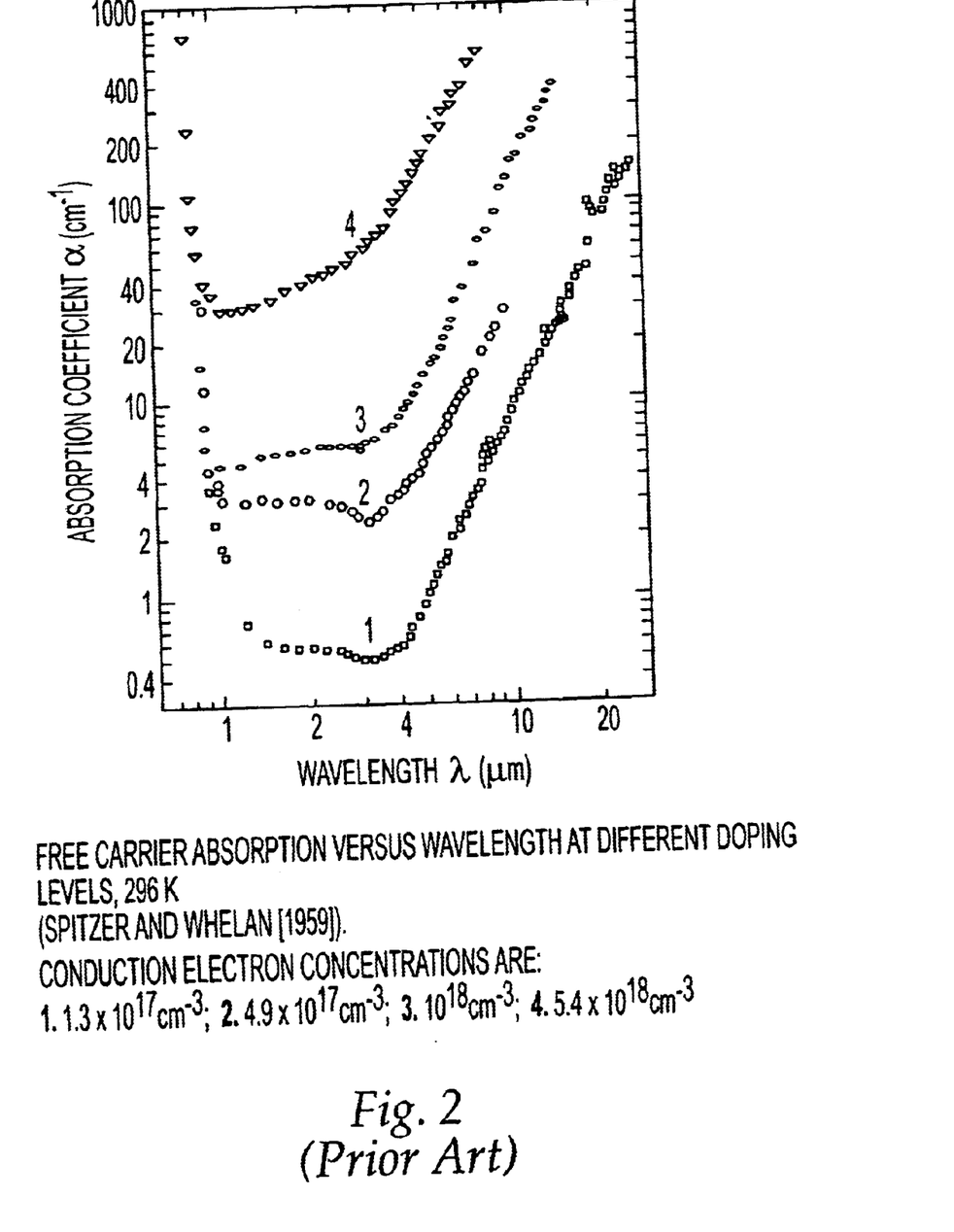
FIG. 2 is a graph showing the free carrier absorption of gallium arsenide versus wavelength at various doping levels.

For every doping level tested by Spitzer and Whelan, the optical absorption coefficient was found to be at a local minimum over a wavelength range from about 1.0 to about 4.0 μm. For example, the absorption coefficient for a conduction electron concentration of $4.9 \cdot 10^{17}$ cm$^{-3}$ is fairly constant at about 3.0 cm$^{-1}$ within the wavelength range from 1.0 to 4.0 um. Similarly, the absorption coefficient for a conduction electron concentration of $1.3 \cdot 10^{17}$ cm$^{-3}$ is fairly constant at about 0.5 cm$^{-1}$ within the wavelength range from 1.2 to 4.1 um. Thus, based on the results of Spitzer and Whelan, one would expect that as the doping level is decreased, the optical absorption coefficient correspondingly decreases, and the lowest optical absorption coefficient would be obtained when the gallium arsenide was completely undoped.

One would also expect from the results of Spitzer and Whelan that for undoped gallium arsenide, the absorption coefficient would remain at a local minimum throughout the range from about 1.0 to 4.0 μm. One would expect, accordingly, that any wavelength within the range suggested by Sun et al. (1.0 to 3.0 μm) would, in fact, be suitable for trimming a resistor fabricated on undoped gallium arsenide. But the inventors of the present invention have found that this is not the case. Through a series of experiments carried out under their direction, they have found, rather, that the critical range of laser wavelengths at which undoped gallium arsenide does not absorb laser light is much narrower: about 0.9 µm to about 1.5 µm. The inventors found that trimming with laser light having a wavelength shorter than 0.9 µm or longer than 1.6 µm caused damage to the gallium arsenide substrate. The inventors also found that trimming with laser light having a wavelength of 1.047 µm produced the best results. These results were wholly unexpected in light of the teachings of Sun et al. and Spitzer and Whelan.

(The inventors note that their experiments were, in fact, carried out using gallium arsenide that was carbon-doped to a carbon concentration of between $1.0 \cdot 10^{15}$ cm$^{-3}$ and $5.0 \cdot 10^{15}$ cm$^{-3}$. Without this weak n-type doping, deep-level donors (impurities) in the gallium arsenide substrate would have caused the substrate to be slightly p-type. The substrate would thus have been slightly conductive, rather than semi-insulating. The effect of the carbon doping was to raise the conduction electron concentration of the gallium arsenide to about $1.0 \cdot 10^7$ cm$^{-3}$, which is about the same as pure, undoped gallium arsenide. The carbon doping is believed to have had no significant effect on the absorption characteristics of the gallium arsenide. Accordingly, the term "undoped gallium arsenide" is used herein to include all gallium arsenide substrates that are substantially semi-insulating and to exclude all substrates that are substantially conductive, such as those tested by Spitzer and Whelan.)

In addition to the problem described above—finding a wavelength that is suitable to trim resistors fabricated on undoped gallium arsenide—the inventors had to overcome a second problem: the prior art does not disclose a laser output power that is suitable to trim a resistor fabricated on undoped gallium arsenide. A very low doping level allows the gallium arsenide to transmit laser light rather than absorb it, and thus the laser output power can be relatively high without damaging the gallium arsenide. But if the output power is too high, the gallium arsenide will be damaged by the laser light. Thus, the selection of an appropriate power level is not a trivial problem.

To summarize, although the desirability of laser trimming resistors fabricated on gallium arsenide is clear, no prior art reference known to the inventors teaches how to accomplish this feat. Specifically, there is a need to know: (1) the wavelength range at which laser trimming may be carried out; and (2) the laser power needed, based on the doping level in the gallium arsenide, to vaporize the resistor without damaging the gallium arsenide.

Figure 3:
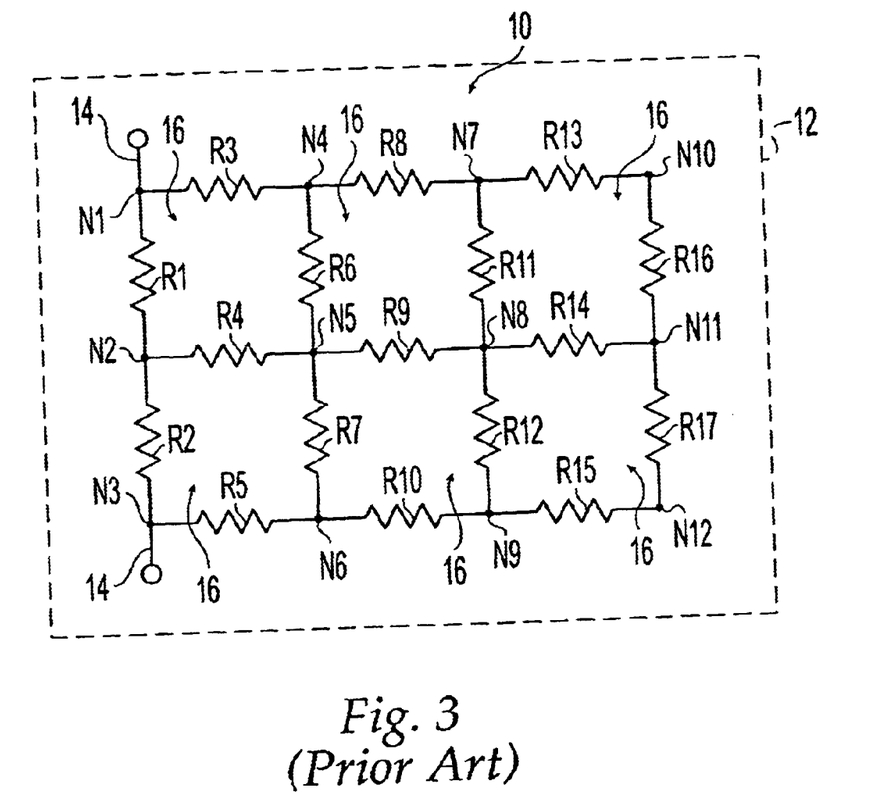
FIG. 3 is a circuit diagram of a typical resistor network found in the prior art.

It is further known in the art to replace resistor 20 of FIG. 1 with a network of identical resistor links similar to those shown in FIG. 1 of Shier (reproduced herein as FIG. 3). With reference to FIG. 3, some of resistor links R1–R17 may be severed by laser in a predetermined pattern to produce a desired equivalent resistance of the network. The network described by Shier, for example, provides network resistances from 1.23 ohms to 9.0 ohms, albeit in two hundred irregular intervals that range from as small 0.0002 ohms to as large as 1.25 ohms.

But the network described by Shier is unsatisfactory for use in trimming bias circuits for power amplifiers for three reasons. First, the network of Shier requires seventeen resistors, each of which takes up space (die area) on integrated circuit 10. It would be highly desirable to reduce the number of resistors that are required in the network, and thereby to reduce the total area required on integrated circuit 10 by the resistor network.

Second, the range described by Shier (1.23 to 9.0 ohms) is small. A typical transistor amplifier requires a quiescent drain-source current of about 130 mA in order to operate with a desired linearity. In order to reliably establish this quiescent current, trimming network resistances must be provided that are adjustable in value from 50 to 1050 ohms.

Third, the resolution of the network of Shier varies greatly. For example, the smallest increase in resistance values in Shier is 0.0001 ohms (from 1.3013 to 1.3014 ohms), while the largest is 1.25 ohms (from 7.75 to 9.0 ohms). This resolution is both too high (for resistances from 1.23 to about 6.0 ohms) and too low (for resistances from 6.0 to 9.0 ohms). That is, the resolution achieved in the range of resistances from 1.23 to about 6.0 ohms is higher than is necessary to produce a quiescent current with an acceptable accuracy. This high resolution is gained at the cost of using many resistors, each of which requires die space on integrated circuit 10. On the other hand, the resolution achieved in the range of resistances from about 6.0 to 9.0 ohms is too low: the quiescent current in this case is insufficiently controlled, and it is possible for the quiescent current to vary outside design limits. Accordingly, a resistor network for trimming bias circuits for power amplifiers is needed that will provide a constant resolution, such as 50 ohms, over its entire resistance range from 50 ohms to 1050 ohms.

OBJECT OF THE INVENTION

Accordingly, an object of the invention is to provide a laser system and method for cleanly processing a thin-film resistor fabricated on an undoped gallium arsenide substrate, without damaging or affecting adjacent circuit elements or the underlying or surrounding substrate. Another object of the invention is to provide a thin-film resistor that is fabricated on an undoped gallium arsenide substrate and that may be laser trimmed. A further object of the invention is to provide a laser-trimmable resistor network that may be used to trim a bias circuit for a power amplifier to obtain a desired quiescent current in the amplifier.

SUMMARY OF THE INVENTION

The present invention is directed to a laser system and method for cleanly trimming or severing resistors fabricated on an undoped gallium arsenide substrate without damaging or affecting adjacent circuit elements or the underlying or surrounding substrate. The system comprises the following elements: (1) a laser source adapted to generate an output at a wavelength within the range of 0.9 to 1.5 µm; (2) a laser-trimmable resistor formed on a gallium arsenide substrate; and (3) a beam positioner and alignment system to align the laser source with the target structure. Preferably, the laser source produces an output within a wavelength range of 0.9 to 1.1 µm, or still more preferably, of about 1.047 µm.

The invention is also directed to a method for trimming a resistor fabricated on a gallium arsenide substrate. The method comprises: (1) generating a laser output at a wavelength in a range of about 0.9 to 1.5 µm; and (2) directing the laser output to illuminate the target resistor. Preferably, the laser output power is within the range from 0.25 to 0.45 µJ. More preferably, the laser output power is about 0.35 µJ.

The invention is further directed to a thin-film resistor suitable for modification by laser, comprising: (1) a substrate of undoped gallium arsenide; (2) a first layer of protective dielectric; and (3) a layer of NiCr. Preferably, a second layer of protective dielectric lies upon the layer of NiCr. In an alternative embodiment, nickel or another thin-film resistive material may be substituted for NiCr. The thicknesses of these layers are preferably as follows: (a) substrate, about 500 µm; (b) first dielectric, about 840 angstroms (Å); (c) NiCr, about 430 Å; and (d) second dielectric, about 940 Å.

Electrical connections to a trimmable resistor having the above structure may be made via a metallization layer located at the ends of the resistor. The metallization layer may contact the NiCr from either side or from above.

The invention is further directed to a laser-trimmable resistive network suitable for trimming a bias circuit for a power amplifier. The resistor network comprises: (1) first and second resistive-film resistors in parallel; (2) a third resistive-film resistor joining one end of said first resistive-film resistor with the corresponding end of said second resistive-film resistor; (3) a fourth resistive-film resistors connected at one end to the node formed by said first resistive-film resistor and said third resistive-film resistor; and (4) a fifth resistive-film resistors connected at one end to the node formed by said second resistive-film resistor and said third resistive-film resistor. Preferably, the first resistive-film resistor has a resistance which is less than one of said fourth resistive-film resistor and said fifth resistive-film resistor. Still more preferably, the first resistive-film resistor has a resistance which is no more than half of the resistance of one of said fourth resistive-film resistor and said fifth resistive-film resistor.

DETAILED DESCRIPTION OF THE INVENTION

In one embodiment of the invention, a laser system suitable for trimming a thin-film resistor fabricated on undoped gallium arsenide comprises: (1) a laser source adapted to generate an output at a wavelength within the range of 0.9 to 1.5 $\mu$m; (2) a thin-film resistor formed on an undoped gallium arsenide substrate; and (3) a beam positioner and alignment system capable of aligning the laser with the resistors to be modified. The laser source preferably produces an output within a wavelength range of 0.9 to 1.1 $\mu$m, or still more preferably, of about 1.047 $\mu$m. In a preferred embodiment, the laser source is a conventional diode-pumped, solid-state laser with a lasant crystal, such as an Nd:YLF. Successful laser trimming of thin-film resistors on an undoped gallium arsenide substrate has been achieved using a laser energy output of 0.35 $\mu$J of energy pulsed at a Q-rate of 10,000 pulses per second and concentrated to a spot size of 8 $\mu$m. It is expected that the system could trim thin-film resistors effectively even if the power output varied within the range from 0.25 to 0.45 $\mu$J, or if the spot size varied within the range from 4 to 12 $\mu$m, or if the Q-rate varied within the range from 8,000 to 12,000 pulses per second.

A beam positioner and alignment frame for directing the radiation from the laser source accurately to the thin-film resistor to be modified are also required. A galvanometer-based positioner with stationary optics with a positioning accuracy of about 1.0 $\mu$m and a positioning resolution of about 0.06 $\mu$m was found to be suitable for use with the present invention. An alignment frame having an X-Y table repeatability of +/−6.5 $\mu$m, a Z resolution of about +/−0.5 $\mu$m, and a theta resolution of about 50 microradians was also suitable. Such beam positioners and alignment frames are conventional commercial equipment well-known to those of skill in the art; an example is the M310 Monolithic Trim System manufactured by G.S.I. Lumonics, Inc. Those of skill in the art will recognize, of course, that the required positioning accuracy and resolution are directly related to the geometry of the thin-film resistor and nearby circuitry, and should be selected appropriately.

Figure 4:
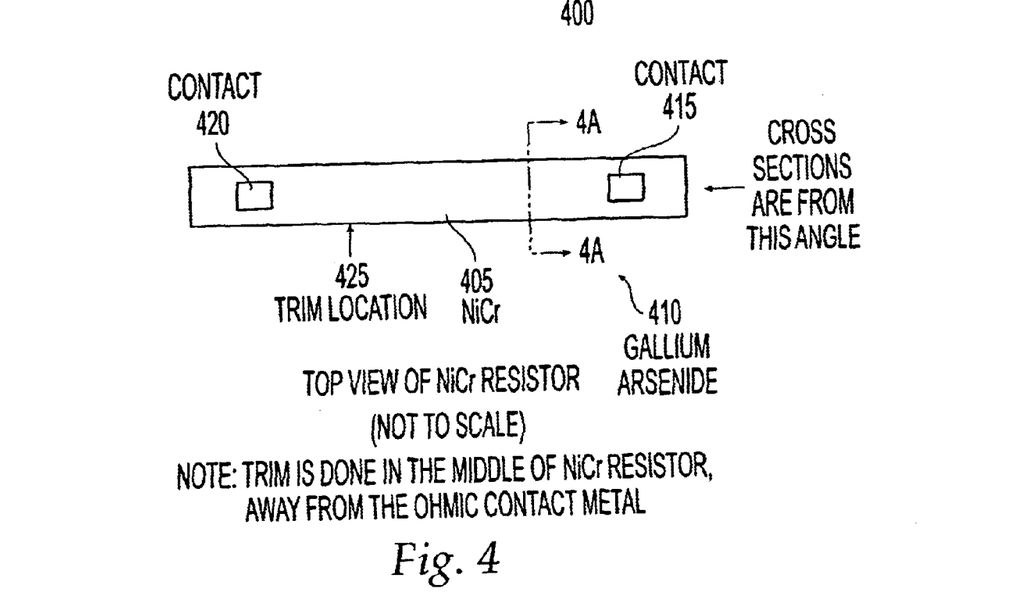
FIG. 4 is a top-view and a cross-sectional view (A—A) of a thin-film resistor in accordance with the present invention.

FIG. 4 is a top-view of a thin-film resistor 400 that is suitable for laser trimming in accordance with the present invention. Resistor 400 comprises a rectangular area of NiCr 405 fabricated on an undoped gallium arsenide substrate 410. Alternatively, NiCr 405 may be replaced with any other thin-film resistive material having an absorption coefficient that is of about the same magnitude as NiCr, such as nickel. The width, length, and sheet resistance of resistor 400 may be selected by techniques known in the art, such that a desired resistance is achieved within desired tolerances, taking into account the variations inherent in the fabrication process. In a preferred embodiment, the resistor has a width within a range from about 2 to about 100 $\mu$m, and a sheet resistance of about 10 to 100 ohms/square unit. At each end of the NiCr 405, a contact area 415, 420 is shown at which a metal interconnection to the NiCr 405 is made, either from above or below the NiCr 405. The laser would trim or cut the NiCr 405 at trim location 425.

Figure 4A:
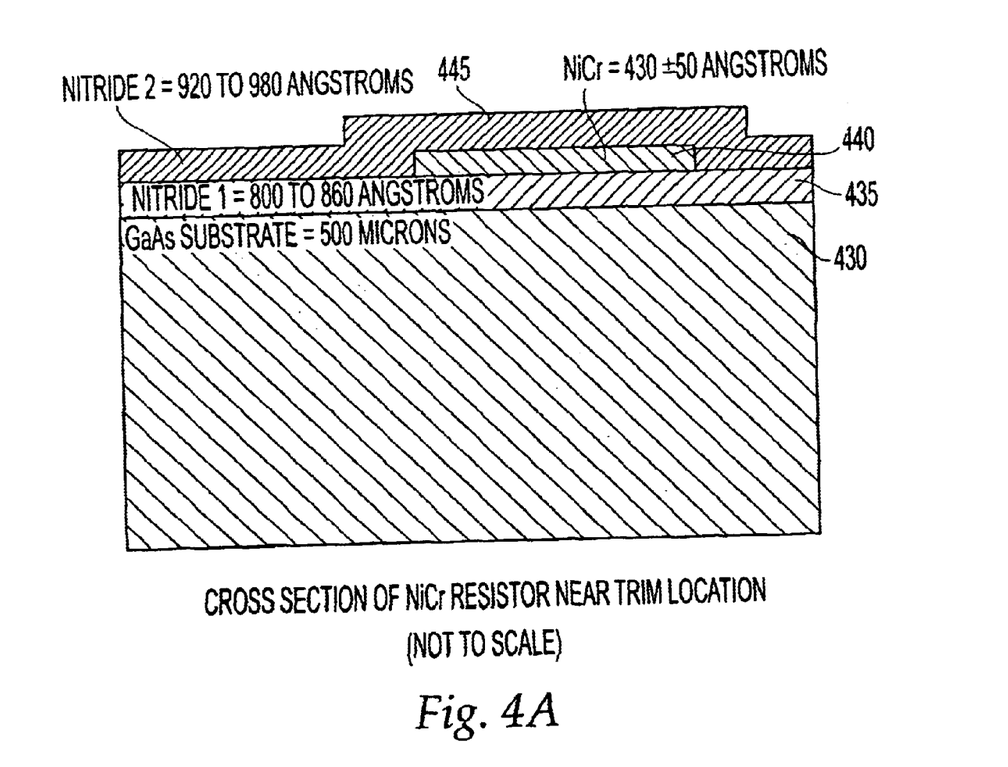

Section A—A shows a cross-section through resistor 400 at trim location 425. Resistor 400 is fabricated on an undoped gallium arsenide substrate 430 and comprises a first layer of protective dielectric 435 and a resistive layer 440 of NiCr. Preferably, the resistor also includes a second layer of protective dielectric 445, which prevents laser trimming by-products or slag from splattering other integrated circuit elements. The protective dielectric layers are preferably composed of silicon nitride. The thicknesses of these layers are preferably as follows: (a) substrate, about 500 $\mu$m; (b) first dielectric, about 840 Å; (c) NiCr, about 430 Å; and (d) second dielectric, about 940 Å.

Figure 5:
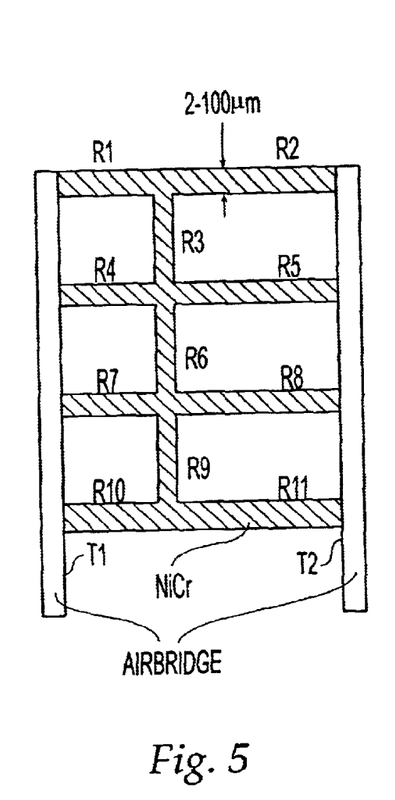
FIG. 5 is a top view of a resistive trim network in accordance with the present invention.

FIG. 5 is a top view of a novel resistive trim network suitable for use with a bias circuit for a power amplifier that requires a quiescent current of 130 mA. The trim network comprises thin-film resistors R1 through R11 fabricated on an undoped gallium arsenide substrate and having a layer structure as described above. According to the present invention, resistors R1 through R11 are arranged in an asymmetrical array of series resistors, parallel resistors, and tying resistors. That is, resistors R1, R4, R7 and R10 are in series with resistors R2, R5, R8 and R11, respectively, forming four parallel branches between air bridge terminals T1 and T2. (An air bridge is a small plated gold wire structure on the top surface of a gallium arsenide integrated circuit. No support is provided along the span of the air bridge, although there is usually a passivating layer underneath it that prevents shorting. Air bridges are used to make interconnections between circuit elements.)

The four parallel branches are connected together via tying resistors R3, R6, and R9. In order to provide both gross and fine adjustment of the total network resistance, in a preferred embodiment, resistors R2, R5, R8, and R11 (the "low-resolution resistors") have resistance values more than two times those of resistors R1, R4, R7, and R10 (the "high-resolution resistors") and of tying resistors R3, R6, and R9. This asymmetrical design of the resistor array provides an finer resolution for the network resistance compared with the resolution of known arrays having a symmetrical layout.

The resistance of the resistive network in FIG. 4 is set by severing one or more of the resistors R1–R11 by directing the laser radiation across the resistor. The minimum network resistance is obtained when all of resistors R1–R11 are left intact (unsevered). The maximum network resistance is obtained by severing R1, R4, R5, R7, R8, and R11, such that the resistive path remaining between air bridge terminals T1 and T2 is formed by resistors R10, R9, R6, R3, and R2 in series. Various increments of network resistance can be achieved by severing or leaving intact various combinations of high-resolution resistors R1, R4, R7 and R10, low-resolution resistors R2, R5, R8, and R11, and tying resistors R3, R6 and R9.

In a preferred embodiment, each of resistors R1, R3, R4, R6, R7, R9, and R10 has a resistance of 400 ohms and each of resistors R2, R5, R8, and R11 has a resistance of 200 ohms. Under these conditions, the network provides a resolution of 50 ohms and a range from 150 to 1050 ohms. Alternatively, it is considered within the ability of a person of ordinary skill in the art to select different values for R1 through R11, in order to achieve a desired resistance range and resolution for the network.

Figure 6:
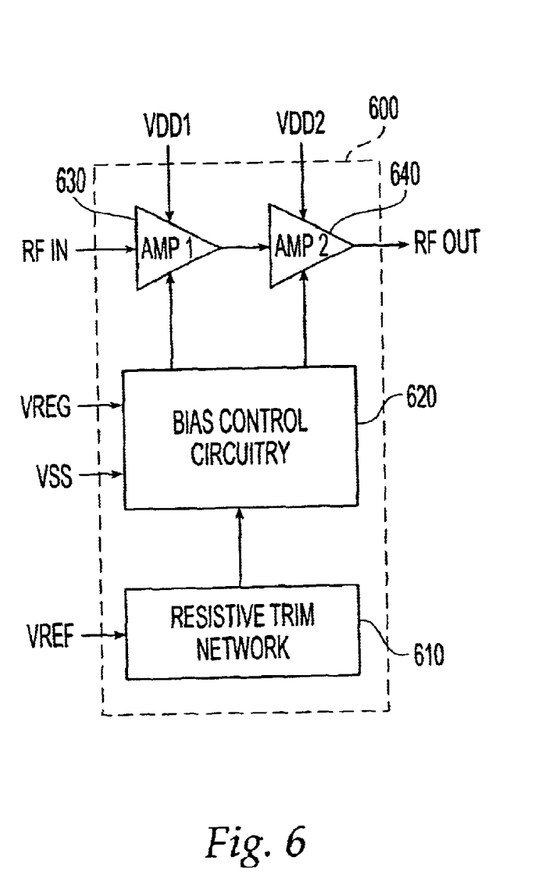
FIG. 6 is a block diagram illustrating the use of the resistive trim network of FIG. 5 in a power amplifier bias control circuit.

FIG. 6 illustrates an application of the resistive trim network of FIG. 5 to establish a reference current for a power amplifier bias control circuit. Resistive trim network 610 is connected as shown between VREF and bias control circuitry 620. After fabrication of integrated circuit 600, the quiescent currents in amplifiers 630, 640 are measured, and automated test equipment determines whether the reference current into bias control circuitry 620 needs to be decreased to compensate for process variations that may have occurred during the fabrication. A desired network resistance is calculated using predetermined formulas, and the network is modified by laser as appropriate to achieve the desired resistance.

Figure 7:
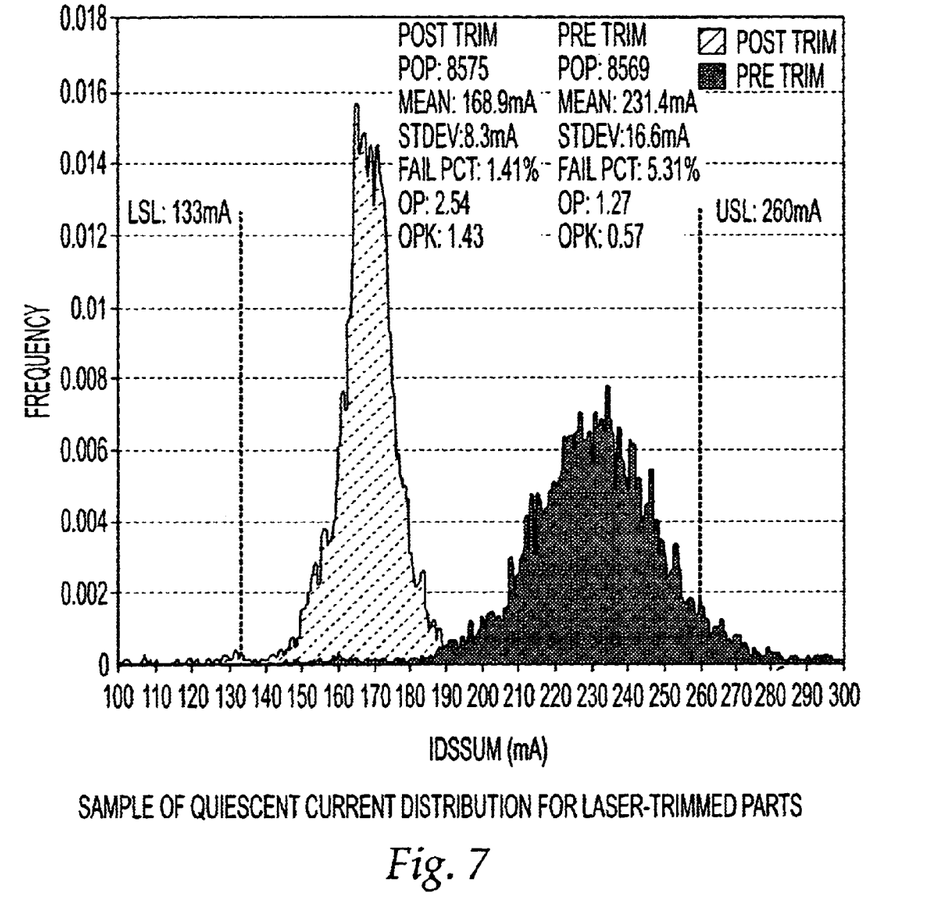
FIG. 7 is a chart of the results obtained by laser trimming the resistive trim networks in a sample group of power amplifiers of the type shown in FIG. 6. The chart displays the various amplifier quiescent currents measured before and after trimming.

The results of this trimming process are illustrated in FIG. 7, which is a chart of the results obtained by laser trimming the resistive trim networks in a sample group of power amplifiers of the type shown in FIG. 6. The chart displays the various amplifier quiescent currents measured before and after trimming. It may readily be seen from FIG. 7 that the standard deviation of the quiescent current before trimming, 16.6 mA, was greatly improved to a standard deviation of only 8.3 mA after trimming.

While the invention has been described with reference to specific embodiments, it will be appreciated by those of ordinary skill in the art that modifications can be made to the structure and form of the invention without departing from its spirit and scope, which is defined in the following claims.

What is claimed is:

1. A laser system for processing a gallium arsenide integrated circuit, comprising:
   a. a substrate of undoped gallium arsenide
   b. a resistor formed on said substrate; and
   c. a laser adapted to generate an output at a wavelength within the range of about 0.9 to about 1.5 $\mu$m and at a power sufficient to modify the resistance of said resistor; and
   d. a beam positioning and alignment system;
   e. wherein said beam positioning and alignment system causes said laser to target and trim said resistor.

2. The laser system of claim 1, wherein said laser source produces an output within a wavelength range of about 0.9 to 1.19 $\mu$m.

3. The laser system of claim 1, wherein said laser source produces an output having a wavelength of about 1.047 $\mu$m.

4. The laser system of claim 1, wherein said laser source produces an output having a power of about 0.25 $\mu$J to about 0.45 $\mu$J.

5. The laser system of claim 1, wherein said laser source produces an output having a spot size of about 4 $\mu$m to about 12 $\mu$m.

6. The laser system of claim 1, wherein said laser source has a Q-rate of about 8,000 pulses per second to 12,000 pulses per second.

7. The laser system of claim 1, wherein said resistive film is one of NiCr and nickel.

8. The laser system of claim 1, wherein said resistive film has an optical absorption coefficient that is of about the same magnitude as that of NiCr.

9. The laser system of claim 1, further comprising a separation dielectric layer between the resistor and the substrate, a passivation dielectric layer substantially covering the resistor, and the laser further adapted to modify the resistance of the resistor through the passivation dielectric layer covering the resistor.

10. The laser system of claim 9, wherein the passivation dielectric layer is about 920 Å.

11. The laser system of claim 9, wherein the passivation dielectric layer comprises SiN.

12. The laser system of claim 9, wherein the resistor is a laser trimmable resistive network comprising a plurality of parallel and series resistive segments.

13. A method for processing an integrated circuit, comprising:
   a. generating a laser output at a wavelength an a range of about 0.9 to 1.5 $\mu$m and at a power sufficient to vaporize portions of a resistive film fabricated on a gallium arsenide substrate; and
   b. directing the laser output at the resistive film via, a beam positioning and alignment system.

14. The method of claim 13 wherein said laser output is generated within a wavelength range of 0.9 to 1.19 $\mu$m.

15. The method of claim 13, wherein said laser output is generated with a wavelength of about 1.047 $\mu$m.

16. The method of claim 13, wherein the resistive film is covered by a passivation dielectric layer and fabricated on a separation dielectric layer between the gallium arsenide substrate and the resistive film, and the step of generating further comprises vaporizing portions of the resistive film through the passivation dielectric layer.

17. The method of claim 16, wherein the resistive film is a laser trimmable resistive network comprising a plurality of resistive segments in parallel and series with each other.

18. The method of claim 16, wherein the passivation and separation dielectric layers comprise SiN.

19. The method of claim 16, wherein the passivation dielectric layer is about 920 Å thick.

20. The method of claim 16, wherein the laser has an output having a power of about 0.25 $\mu$J to about 0.45 $\mu$J.

* * * * *